United States Patent
Chang et al.

(10) Patent No.: US 8,158,521 B2
(45) Date of Patent: Apr. 17, 2012

(54) TWO STEP POST-DEPOSITION TREATMENT OF ILD LAYER FOR A LOWER DIELECTRIC CONSTANT AND IMPROVED MECHANICAL PROPERTIES

(75) Inventors: Hui-Lin Chang, Hsin-Chu (TW); Chung-Chi Ko, Nantou (TW); Tien I Bao, Hsin-Chu (TW); Yun-Chen Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 582 days.

(21) Appl. No.: 11/781,632

(22) Filed: Jul. 23, 2007

(65) Prior Publication Data
US 2008/0014369 A1    Jan. 17, 2008

Related U.S. Application Data

(63) Continuation of application No. 10/666,354, filed on Sep. 19, 2003, now Pat. No. 7,250,370.

(51) Int. Cl.
*H01L 21/311* (2006.01)

(52) U.S. Cl. ........ 438/694; 438/692; 438/700; 438/740; 438/780; 257/759; 216/17; 216/18; 216/39; 216/41; 216/58

(58) Field of Classification Search .................. 438/694, 438/692, 700, 704, 780, 781; 257/759; 216/18, 216/39, 41, 58
See application file for complete search history.

(56) References Cited

U.S. PATENT DOCUMENTS

| | | | |
|---|---|---|---|
| 5,858,869 A * | 1/1999 | Chen et al. ..................... | 438/597 |
| 6,028,015 A | 2/2000 | Wang et al. | |
| 6,103,601 A | 8/2000 | Lee et al. | |
| 6,147,009 A * | 11/2000 | Grill et al. ..................... | 438/780 |
| 6,204,204 B1 | 3/2001 | Paranjpe et al. | |
| 6,346,488 B1 | 2/2002 | Kabansky | |
| 6,372,301 B1 | 4/2002 | Narasimhan et al. | |
| 6,403,464 B1 | 6/2002 | Chang | |
| 6,413,856 B1 * | 7/2002 | Lou ............................... | 438/638 |
| 6,436,808 B1 | 8/2002 | Ngo et al. | |
| 6,465,372 B1 | 10/2002 | Xia et al. | |

(Continued)

OTHER PUBLICATIONS

Wolf, Stanley, Ph.D., et al., "Silicon Processing for The VLSI Era" vol. 1: Process Technology, Lattice Press, Sunset Beach, CA, 1986, p. 441.

(Continued)

*Primary Examiner* — Nadine Norton
*Assistant Examiner* — Maki Angadi
(74) *Attorney, Agent, or Firm* — Haynes and Boone, LLP (57) ABSTRACT

A method of lowering the dielectric constant of an organo-silicon low k dielectric layer while improving the hardness and thermal stability is provided. A deposited layer of carbon doped oxide, HSQ, or MSQ is cured and treated with a He plasma which improves hardness for a subsequent CMP step and lowers the dielectric constant. There is no loss of $H_2O$ or $CH_4$ during the He treatment. The low k dielectric layer is then treated with a $H_2$ plasma which converts some of the Si—O and Si—$CH_3$ bonds near the surface to Si—H bonds, thereby further lowering the dielectric constant and increasing thermal stability that improves breakdown resistance. Moisture uptake is also reduced. The method is especially useful for interconnect schemes with deep sub-micron ground rules. Surprisingly, the k value obtained from two different plasma treatments is lower than when two He treatments or two $H_2$ treatment are performed.

23 Claims, 6 Drawing Sheets

U.S. PATENT DOCUMENTS

| | | | |
|---|---|---|---|
| 6,486,061 | B1 | 11/2002 | Xia et al. |
| 6,528,423 | B1 | 3/2003 | Catabay et al. |
| 6,537,896 | B1 | 3/2003 | Catabay et al. |
| 6,846,756 | B2 * | 1/2005 | Pan et al. ............... 438/798 |
| 6,936,533 | B2 | 8/2005 | Kim et al. |
| 6,953,608 | B2 | 10/2005 | Leu et al. |
| 2002/0106891 | A1 * | 8/2002 | Kim et al. ............... 438/624 |

OTHER PUBLICATIONS

Jean-Jong Kim et al., "The Effects of Plasma Treatment on SiO2 Aerogel Film Using Various Reactive (O2, H2, N2) and Non-reactive (He, Ar) Gases", Thin Solid Films, 377-378, pp. 525-529, 2000, Elsevier Science B.V. (Abstract).

Yong Chun Qual et al., "Significant Improvement of Electrical and Thermal Properties of Low Dielectric Constant Plasma Polymerized Paraxylene Thin Films by Postdeposition H2 + He Plasma Treatment", Journal of Applied Physics, 89(2), pp. 1402-1404, Jan. 15, 2001, American Institute of Physics. (Abstract).

Chinese Office Action issued in corresponding Application No. 03156866.1, 10 pages.

* cited by examiner

TWO STEP POST-DEPOSITION TREATMENT OF ILD LAYER FOR A LOWER DIELECTRIC CONSTANT AND IMPROVED MECHANICAL PROPERTIES

RELATED APPLICATIONS

This application is a continuation of U.S. application Ser. No. 10/666,354 filed Sep. 19, 2003, which is hereby incorporated by reference. This application is related to U.S. application Ser. No. 10/421,187 filed Apr. 23, 2003, which is commonly assigned.

FIELD OF THE INVENTION

The invention relates to the field of fabricating a semiconductor device and in particular to a method of improving the mechanical and insulating properties of a low k dielectric layer used to isolate metal layers in an interconnect structure.

BACKGROUND OF THE INVENTION

An important process during the fabrication of semiconductor devices is formation of metal interconnects that provide electrical paths between conductive layers. Metal interconnects consist of trenches that provide horizontal connections between conductive features and vias or contacts that provide vertical connections between metal layers. Metal layers are insulated from each other by a dielectric layer to prevent capacitance coupling or crosstalk between the metal wiring. Recent improvements in interlevel dielectric layer (ILD) performance have involved replacing $SiO_2$ that has a dielectric constant (k) of about 4 with a low k material that has a k value between 2.5 and 3.5 such as carbon doped $SiO_2$ and fluorine doped $SiO_2$ which is also called fluorosilicate glass (FSG).

One form of carbon doped oxide is called SiCOH and is typically deposited by a chemical vapor deposition (CVD) or plasma enhanced CVD (PECVD) method from an organosilane precursor and oxygen source to afford a Si content of 15-18 atomic %, an oxygen content of 28-30 at. %, a carbon content of 16-18 at. %, and a hydrogen content of 36-38 atomic %. SiCOH includes Si—O, Si—C, and Si—H bonds according to infrared analysis. Other low k dielectric materials that are used as ILD layers include polymers such as hydrogen silsesquioxane (HSQ), methylsilsesquioxane (MSQ), poly(arylether), and fluorinated polyimide which are applied by a spin-on procedure and have good cap filling capability. HSQ and MSQ ($CH_3SiO_{1.5}$) typically do not reach a low k value until heated to temperatures of about 400° C. These low k dielectric materials are normally cured by baking from about 350° C. to 450° C. in order to drive out residual water, solvents, or traces of monomers that could outgas in subsequent thermal cycles and degrade device performance. For example, water may have a corrosive effect on copper and traces of nitrogen containing compounds can poison a photoresist patterning step used to form vias or trenches in the dielectric layer.

A transmission delay in the wiring which is commonly known as an RC delay is a function of capacitance between the metal layers and resistance within the wiring. RC delay is not only improved by switching to a low k dielectric material that reduces parasitic capacitance but also by replacing aluminum with copper wiring that has a lower resistivity.

Low k dielectric layers, especially carbon doped silicon oxide, HSQ, and MSQ exhibit a high porosity and low density which yields a soft film that has stress related issues. For instance, a chemical mechanical polish (CMP) step is typically used to planarize low k dielectric layers or a metal layer adjacent to a low k dielectric material. The etching and polishing action during a CMP step is likely to scratch or form an indentation in the surface of a soft insulating material. These surface defects will degrade device performance if not corrected by an expensive rework process.

Although a carbon doped oxide layer and SiCOH in particular is becoming more popular as ground rules shrink in newer semiconductor devices, the material must be densified in a post-deposition step or water is easily absorbed during a storage period that may vary from a few minutes to several hours before the next step in the fabrication scheme. Water uptake leads to a large increase in dielectric constant which defeats the purpose of the low k dielectric material.

Prior art methods for densifying low k dielectric layers include a plasma treatment with $N_2$ and He in U.S. Pat. No. 6,465,372. The densification is preferably done with $N_2$ at a temperature of about 400° C. and prevents loss of carbon during subsequent oxidizing processes such as plasma etches. The densification leaves the C—H and Si—C bonds intact and does not change the refractive index or dielectric constant of the film.

U.S. Pat. No. 6,403,464 provides a method for removing moisture from a low k dielectric layer and is a high density nitrogen plasma treatment at a temperature of from 350° C. to 450° C. U.S. Pat. No. 6,436,808 employs a $NH_3/N_2$ plasma treatment of an ILD layer such as SiCOH that is repeated one or more times during a damascene process. This method maintains Si—H bonds that are needed for a constant low k value.

Figure 1:
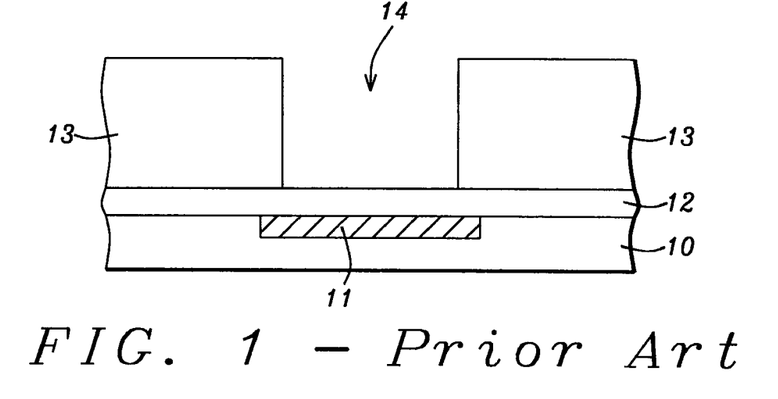
FIGS. 1-2 are cross-sectional views depicting a prior art method of employing a low k dielectric layer in a damascene structure.

A popular means of producing an interconnect structure is by a damascene technique in which an opening 14 such as a via shown in FIG. 1 is etched in a stack comprised of dielectric layer 13 on an etch stop layer 12 that has been deposited on a substrate 10. Substrate 10 is comprised of at least one conductive layer 11 and one or more dielectric layers (not shown). The opening is initially formed in a photoresist layer (not shown) that serves as an etch mask for the pattern transfer.

Figure 2:
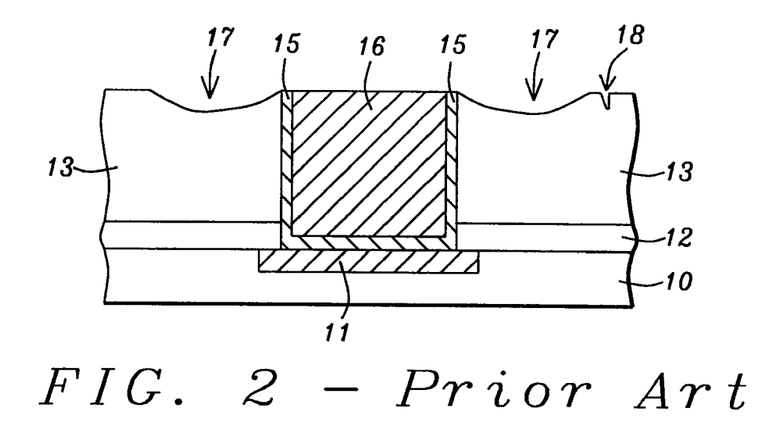

In FIG. 2, a diffusion barrier layer 15 is deposited in the opening 14 by a CVD method followed by deposition of a metal layer 16 to fill the opening. Diffusion barrier layer 15 protects metal layer 16 from traces of water or other chemicals contained in dielectric layer 13 or in etch stop layer 12. A CMP step is then used to lower the metal layer 16 to be coplanar with dielectric layer 13.

One problem associated with the damascene process is that a soft dielectric layer 13 is susceptible to the formation of defects such as a divot 17 and a scratch 18. For example, a SiCOH layer that is not densified is likely to suffer divot and scratch defects 17, 18 that may be removed by a rework process but such an effort adds considerable expense to the fabrication scheme. An uneven surface surrounding the metal layer 16 is not tolerable. One concern is that a subsequent photoresist patterning step on dielectric layer 13 will have a small process window because of an uneven thickness resulting from divots 17. Therefore, a method that hardens dielectric layer 13 prior to a polish step is necessary. Furthermore, dielectric layer 13 is preferably transformed into a more thermally stable layer in order to avoid a breakdown during subsequent thermal cycles.

One stabilization approach mentioned in U.S. Pat. No. 6,028,015 treats a low k dielectric layer with $H_2$ plasma. The process is believed to convert a dangling bond on Si to a Si—H bond and also prevents moisture from being attracted to the reactive Si sites. Similarly, a fluorine doped $SiO_2$ layer is treated with hydrogen plasma in U.S. Pat. No. 6,103,601. In U.S. Pat. No. 6,372,301, a hydrogen plasma treatment of a fluorinated $SiO_2$ layer improves adhesion to a subsequently deposited diffusion barrier layer in a via. Another post-deposition treatment of a low k dielectric film involves a densification of a Si—O—C layer in $NH_3$ at 400° C. or optionally with a He, Ar, or $N_2$ plasma. A hydrogen ion implant to inhibit cracking in a low k film is performed with a plasma immersion ion implantation in U.S. Pat. No. 6,346,488.

A plasma treatment with $Ar/H_2$ is described in U.S. Pat. No. 6,204,204 for reducing resistivity in a TaN barrier layer. Another plasma treatment in U.S. Pat. No. 6,528,423 improves resistance in a SiC barrier layer to Cu migration.

A post-deposition method is also desirable that is able to further improve the insulating property of a low k dielectric layer. Prior art methods can prevent a dielectric constant from becoming larger by blocking water absorption but these processes do not teach how to lower a k value of a deposited film. Unfortunately, none of the prior art methods are capable of densifying a low k dielectric layer, improving its thermal stability and reducing its dielectric constant in a single process.

SUMMARY OF THE INVENTION

An objective of the present invention is to provide a method of hardening a low k dielectric layer such that it is more resistant to mechanical stresses including a CMP process and an applied vacuum on the back side of a substrate by a wafer chuck in a process tool.

A further objective of the present invention is to reduce the dielectric constant of a deposited low k dielectric layer to further enhance its insulating property.

A still further objective of the present invention is to improve the thermal stability of a low k dielectric layer so that it has a higher breakdown threshold and is more chemically inert.

Yet another objective of the present invention is to provide a plasma treatment method that is compatible with current etch and deposition techniques so that new tools and materials are not required.

These objectives are achieved by depositing a low k dielectric layer on a substrate. The low k dielectric layer is preferably a carbon doped oxide layer but may also be HSQ, MSQ, or similar organosilicon materials known to those skilled in the art. In one embodiment, a low k material is deposited on an etch stop layer in a damascene scheme. The resulting low k dielectric layer may be cured at a temperature up to 500° C. to drive off water and trace amounts of monomers and solvents.

A key feature of the invention is a two step plasma treatment of the low k dielectric layer. The plasma treatment methods include a plasma enhanced CVD process. In a first step, a helium plasma is applied which promotes the rearrangement of the Si—O matrix to form a more crosslinked network that has a higher mechanical stability. There is no net loss of Si—O or Si—C bonds since no methane or water is detected in a residual gas analysis (RGA). The plasma treatment also lowers the dielectric constant of the cured film. A second step with hydrogen plasma transforms the outer surface of the low k dielectric layer so that it is enriched with Si—H bonds that improve thermal stability. Si—C and Si—O bond breaking does occur and the dielectric constant is lower than is observed when only a He plasma treatment is performed.

The modified low k dielectric layer may be patterned as in a via, contact hole, or trench fabrication without poisoning an adjacent photoresist layer. The modified low k dielectric layer is also more stable towards subsequent thermal treatments and a CMP process.

In a second embodiment, the low k dielectric layer may be formed on a metallization pattern. The metal pattern may be a composite of an anti-reflective layer such as TiN on a metal layer which is aluminum, for example. A conformal oxide liner comprised of a silicon rich oxide (SRO) layer or an undoped silicon glass (USG) layer or both is formed over the metal pattern. A low k dielectric layer such as carbon doped silicon oxide is deposited to fill the gaps between metal lines and forms an uneven layer above the pattern. A two step plasma treatment process is followed as described in the first embodiment. The He plasma treatment lowers the k value of the low k dielectric layer and strengthens its mechanical properties while a subsequent $H_2$ plasma treatment enriches the surface of the low k dielectric layer with Si—H bonds to improve the thermal stability of the layer. The method may be further comprised of depositing a planarizing low k dielectric layer on the treated low k dielectric layer. The planarizing low k dielectric layer is polished by a CMP step if further planarization is required. The method of this invention provides an advantage in that the dielectric constant of the treated low k dielectric layer with improved mechanical and thermal stability is reduced to a lower k value than is realized in an untreated low k dielectric layer.

The present invention is also an interconnect structure comprised of at least a first and second metal layer and a low k dielectric layer that serves as an insulating layer between metal lines in the second metal layer. The low k dielectric layer may extend above the second metal layer when functioning as an interlevel dielectric (ILD) material or may be coplanar with the second metal layer in an intrametal dielectric (IMD) layer capacity.

DETAILED DESCRIPTION OF THE INVENTION

The invention is a method of treating a low k dielectric layer comprised of carbon doped silicon oxide, HSQ, MSQ, or a similar organosilicon composition to improve its performance in a semiconductor device by hardening the layer as well as improving the thermal stability and lowering the dielectric constant of the low k dielectric layer. The method is especially effective in modifying low k dielectric layers in a damascene scheme and in fabrication processes where a dielectric layer is deposited over a metal pattern. The drawings are provided by way of example and are not intended to limit the scope of the invention.

Figure 3:
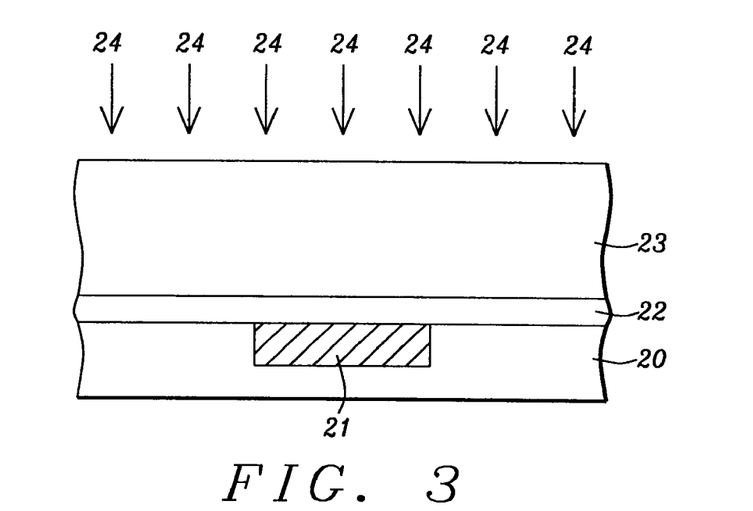
FIGS. 3-6 are cross-sectional views illustrating a plasma treatment method of the present invention in a first embodiment involving a damascene scheme.

A first embodiment related to a damascene scheme is illustrated in FIGS. 3 to 6. Although a single damascene process is depicted, it should be understood that a dual damascene method is also included within the scope of this embodiment. Referring to FIG. 3, a substrate 20 is provided that is typically silicon and which generally contains active and passive devices (not shown). Substrate 20 is comprised of a first metal layer 21 that may be copper, tungsten, aluminum or Al/Cu. Substrate 20 may be further comprised of an optional diffusion barrier layer (not shown) that is formed on the sides and bottom of first metal layer 21 and which separates the first metal layer 21 from a dielectric layer (not shown) in substrate 20. A method such as a CMP step is used to planarize first metal layer 21 so that it is coplanar with the top surface of substrate 20.

An etch stop layer 22 comprised of a material such as silicon nitride, silicon oxynitride, or silicon carbide is deposited by a CVD or PECVD technique on substrate 20 and on the first metal layer 21. Etch stop layer 22 protects first metal layer 21 from aqueous solutions, organic solvents, and etchants used in subsequent process steps.

A low k dielectric layer 23 with a thickness between about 1000 and 10000 Angstroms is then formed on etch stop layer 22. In one embodiment, the low k dielectric layer 23 is comprised of a carbon doped oxide that is deposited by CVD or PECVD technique. The carbon doped oxide is preferably SiCOH which is also known as organosilicate glass (OSG) and is available as Black Diamond™ from Applied Materials, CORAL™ from Novellus, or as HOSP from Allied Signal, for example. The Si source gas and a carbon source gas may be flowed separately into the CVD process chamber or a source gas comprised of Si, C, H, and optionally CO may be employed. Typically, an oxygen source gas such as $N_2O$, $CO_2$, or $O_2$ is also added to the gas mixture during the deposition. For example, an organosilane such as trimethylsilane may be flowed with $O_2$ into the deposition chamber. Optionally, an inert carrier gas such as Ar, $N_2$, or He may be used to transport a Si precursor into the process chamber if the Si precursor is a liquid with a high boiling point, for example.

When the low k dielectric layer 23 is a SiCOH layer, a typical composition is about 15-18 atomic % Si, about 28-30 atomic % oxygen, about 16-18 atomic % carbon, and about 36-38 atomic % hydrogen. However, depending on the deposition conditions and tool type, the composition may be different than in the aforementioned ranges.

In another embodiment, the low k dielectric layer 23 is comprised of a hydrogen silsesquioxane (HSQ) polymer or a methyl silsesquioxane (MSQ) polymer that is formed by a spin-on technique and cured by a conventional method known to those skilled in the art.

The low k dielectric layer 23 is typically cured after deposition by baking substrate 20 in a $N_2$ ambient at about 200° C. to 450° C. for 60 to 240 minutes. The curing step drives off moisture and residual solvents and monomers that may be contained within the low k dielectric layer. The dielectric constant for a cured low k dielectric layer 23 is about 2.8 to 3.2. Unfortunately, the low k dielectric layer is porous and does not have the necessary mechanical strength to withstand subsequent processes such as a chemical mechanical polish (CMP) step that is likely to cause a divot or scratch defect as shown in FIG. 2. The low k dielectric layer 23 will also absorb moisture if exposed to air. Water uptake will increase the k value and can cause metal corrosion in the final device. Thus, the low k dielectric layer 23 must be modified in order to meet the requirements of new technologies that have ground rules with deep sub-micron dimensions.

A key feature of this invention is a two step plasma treatment method that may be performed in any plasma etch chamber but is preferably carried out under plasma enhanced CVD (PECVD) conditions. Preferably, the CVD chamber for the two step PECVD treatment and the process chamber used to deposit the low k dielectric layer 23 are located in the same mainframe (process tool). As depicted in FIG. 3, the first treatment step 24 is performed with a He plasma that is generated using a He flow rate of from 1500 to 6000 standard cubic centimeters per minute (sccm), a RF power of from 300 to 2500 Watts and preferably 600 to 1200 Watts, a chamber pressure between 1 mtorr and 20 torr and preferably 8 mtorr to 12 torr, and with a substrate heated to between 100° C. and 500° C. and preferably 250° C. to 400° C. The He plasma treatment 24 is for a period of 10 to 360 seconds and is preferably for 45 to 90 seconds.

The inventors have unexpectedly found that the He plasma treatment is able to modify the low k dielectric layer 23 into a transformed low k dielectric layer 23a that has a lower dielectric constant and is hardened compared to the low k dielectric layer 23 that has been deposited and cured. It is believed that smaller cage like arrangements of Si—O bonds become crosslinked during the He plasma treatment 24 to form a larger network of Si—O bonds that increases mechanical stability. There is no net loss of Si—$CH_3$ or Si—O bonds as indicated by no change in $CH_4$ or $H_2O$ content in a residual gas analysis (RGA). RGA results (not shown) are plotted as pressure vs. time in seconds for the analysis and show a flat baseline for water and methane. Furthermore, FTIR spectra show no change in the peak at about 1270 cm$^{-1}$ corresponding to Si—C bond stretching when comparing a low k dielectric layer 23 after curing (FIG. 11) to a transformed low k dielectric layer 23a after a He plasma treatment (FIG. 12). However, the k value is lowered in a He plasma treated low k dielectric layer as shown in Table 1 in Example 1. The k value decreases from 3 for a cured low k dielectric layer 23 to 2.78 for the transformed low k dielectric layer 23a. Improved mechanical strength is demonstrated in the transformed low k dielectric layer 23a by a polish rate of 80 Angstroms/min. after the He treatment 24 compared to 150 Angstroms/min. for the low k dielectric layer 23 before the He treatment.

Although a lower k value as a result of the He treatment 24 is beneficial, the inventors have discovered that the dielectric constant of the transformed low k dielectric layer 23a is further reduced by a second treatment involving a $H_2$ plasma process after the He plasma treatment 24. Surprisingly, the dielectric constant resulting from a He plasma treatment followed by a $H_2$ plasma treatment (Sample 6 in Table 1) is less than can be achieved by two He plasma treatments (Sample 4) or with two $H_2$ plasma treatments (Sample 3) of similar duration.

Figure 4:
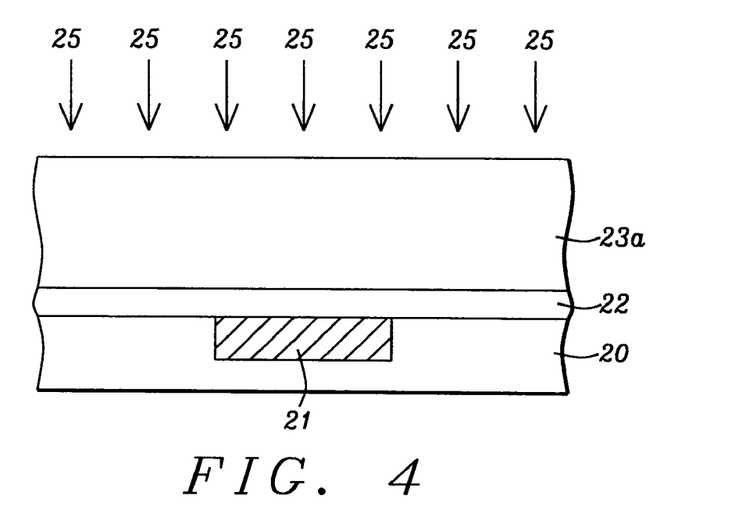

Referring to FIG. 4, $H_2$ plasma 25 is preferably generated in the same chamber used for He plasma treatment 24 without breaking a vacuum. Substrate 20 with transformed low k dielectric layer 23a is subjected to $H_2$ plasma generated with the following conditions: a $H_2$ flow rate from 1500 to 6000 sccm; a RF power of from 300 to 2500 Watts and preferably 600 to 1200 Watts; a chamber pressure of 1 mtorr to 10 torr and preferably 1 mtorr to 6 torr; and a substrate temperature of 100° C. to 500° C. and preferably 250° C. to 400° C. The $H_2$ plasma treatment 25 is performed for a period of about 10 to 360 seconds and preferably for 45 to 90 seconds.

Figure 5:
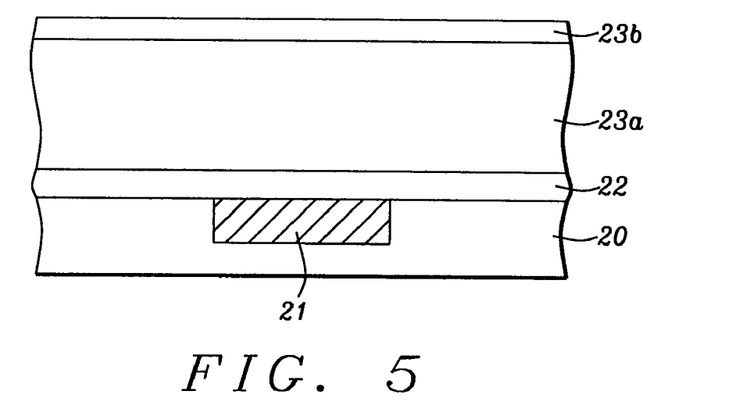

Unlike the He treatment 24, the $H_2$ plasma treatment 25 does result in a net loss of Si—O and Si—$CH_3$ bonds due to cleavage of Si—O and Si—C bonds. A composite low k dielectric layer comprised of a low k dielectric layer 23b that is enriched in Si—H bonds and which is believed to be from about 1000 to 3000 Angstroms thick and the transformed low k dielectric layer 23a is formed as depicted in FIG. 5. Note that an upper portion of the transformed low k dielectric layer 23a in FIG. 4 has been converted to the low k dielectric layer 23b in FIG. 5. Therefore, the thickness of the composite low k dielectric layer in FIG. 5 is about the same as the thickness of the transformed low k dielectric layer 23a in FIG. 4.

Figure 11:
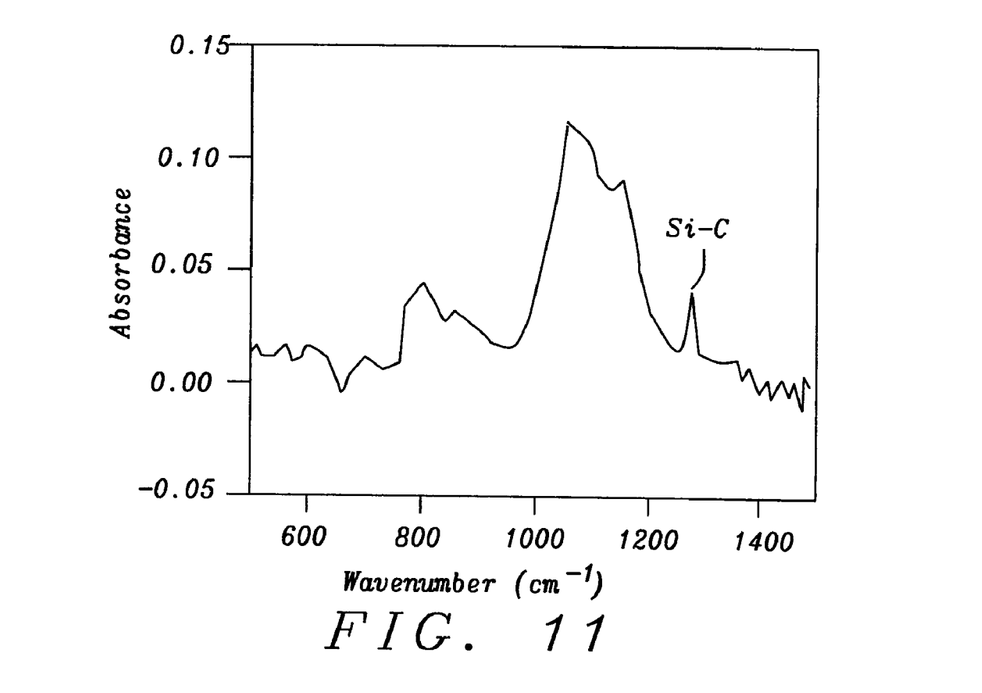
FIG. 11 is a Fourier transform infrared (FTIR) spectrum of a low k dielectric film after curing and before and a plasma treatment of the present invention.
Figure 12:
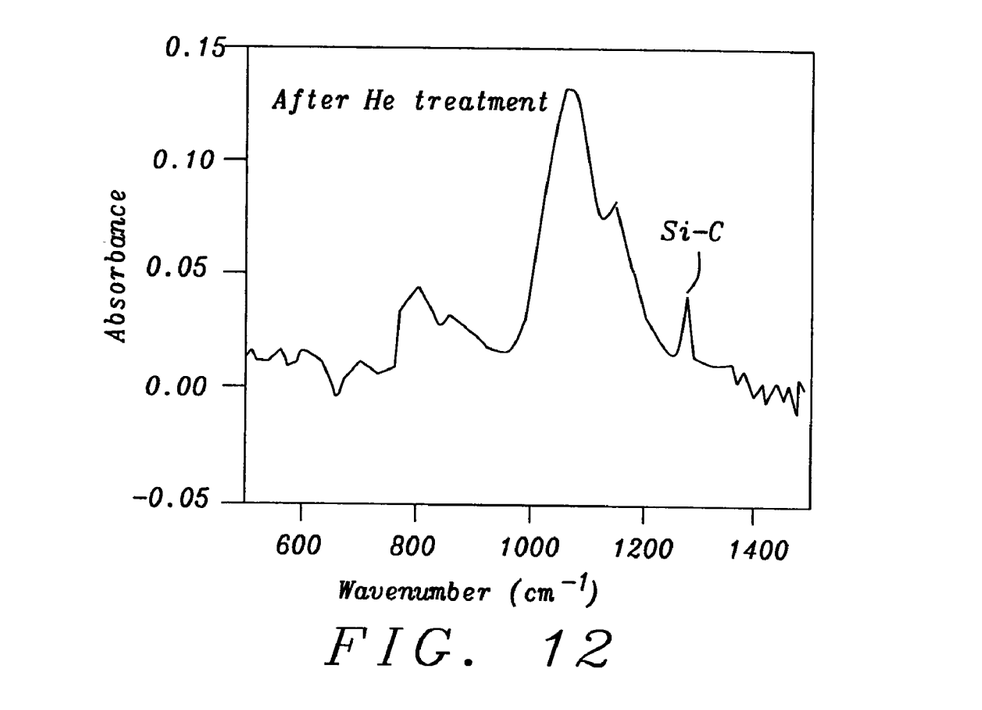
FIG. 12 is a FTIR spectrum of the low k dielectric film in FIG. 11 after a He plasma treatment of the present invention.
Figure 13:
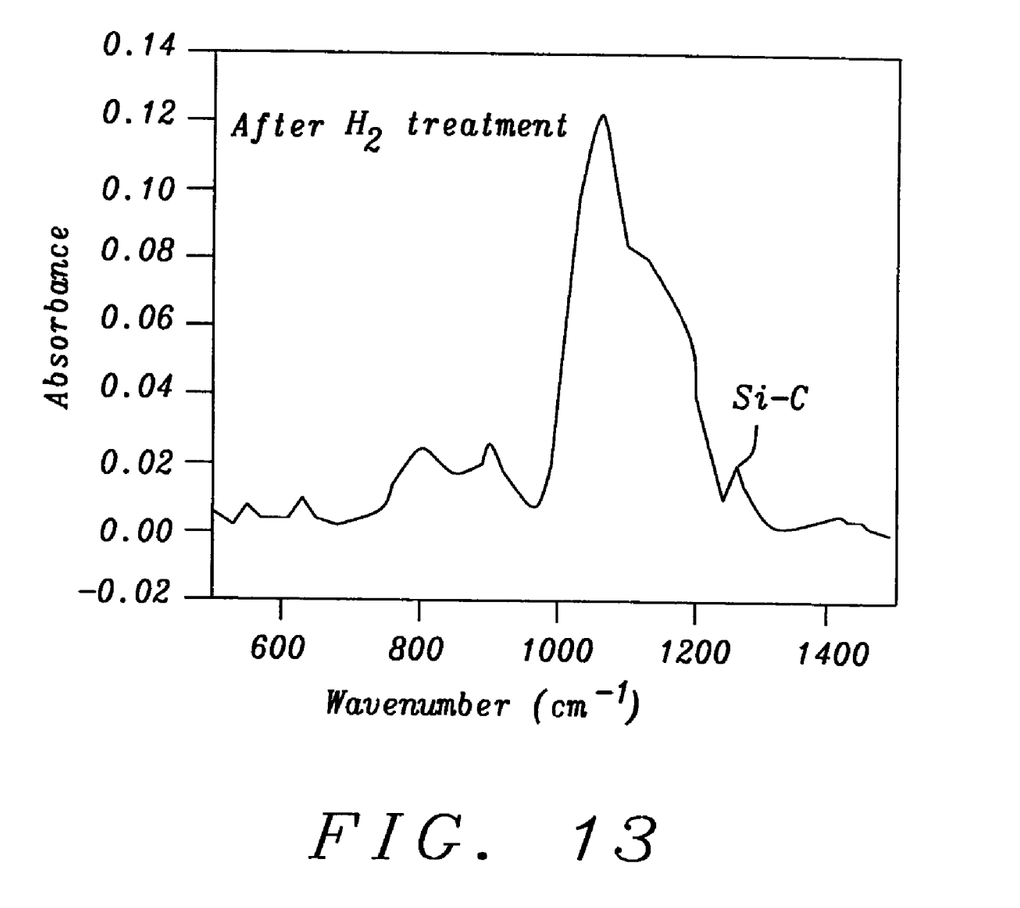
FIG. 13 is a FTIR spectrum of the low k dielectric film in FIG. 11 after a $H_2$ plasma treatment of the present invention.

The FTIR spectrum in FIG. 13 shows that the absorbance at about 1270 cm$^{-1}$ corresponding to Si—C bond stretching in the low k dielectric layer 23b has a lower intensity than the 1270 cm$^{-1}$ absorbance for the cured low k dielectric layer 23 in FIG. 11. It is also believed that some dangling Si bonds or Si atoms with a radical (unpaired electron) are converted to Si—H bonds in the low k dielectric layer 23b. A RGA (not shown) of the H$_2$ plasma treated low k dielectric layer 23b indicates the presence of H$_2$O and CH$_4$ because of Si—C and Si—O bond cleavage. The formation of Si—H bonds causes a further decrease in the dielectric constant as shown by Sample 6 in Table 1. The k value is lowered because of a higher H content and lower oxygen content in the composite low k dielectric layer compared to the transformed low k dielectric layer 23a.

Figure 6:
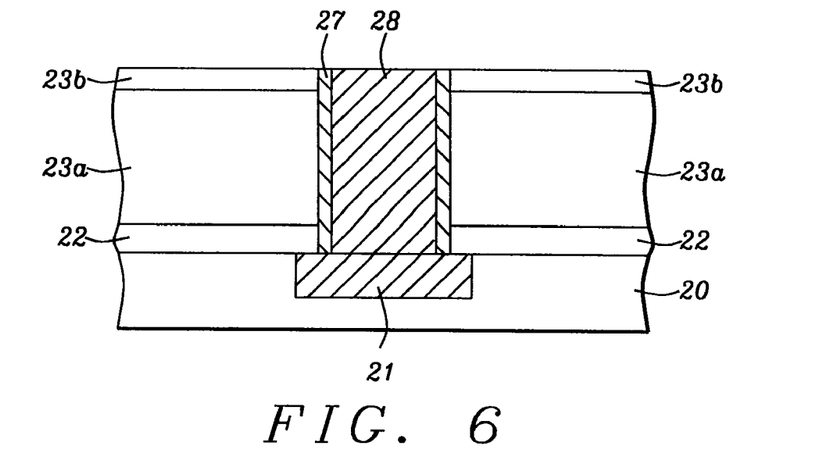

Referring to FIG. 6, the damascene process may proceed with formation of an opening 26 by conventional means which typically involves coating and patterning a photoresist layer (not shown) on the low k dielectric layer 23b and plasma etch transferring the opening through the low k dielectric layer 23b, the transformed low k dielectric layer 23a, and through etch stop layer 22. The remaining photoresist layer is then stripped by an oxygen ashing or with an application of a liquid stripper. Although the opening may be a via or a trench formed above a via, hereafter the opening will be referred to as via 26 in order to describe the single damascene structure shown in FIG. 6. A diffusion barrier layer 27 comprised of one or more of Ta, TaN, Ti, TiN, TaSiN, W. and WN is formed on the sidewalls of the via 26 by a process known to those skilled in the art. Typically, a PECVD process or an atomic layer deposition (ALD) is used to deposit the barrier layer 27. Optionally, the diffusion barrier layer 27 is formed on the sidewalls and bottom of the via 26. A second metal layer 28 that is preferably copper but may be tungsten, Al, or Al/Cu is deposited by a conventional method to fill the via 26. The single damascene structure is normally completed by a CMP step that polishes the second metal layer 28 and the diffusion barrier layer 27 to a lower level that is coplanar with the top surface of the low k dielectric layer 23b. Note that some of the low k dielectric layer 23b may be removed during the CMP step.

An advantage of the present invention is that the plasma treatment steps 24, 25 transform a cured low k dielectric layer into a composite low k dielectric layer comprised of an upper low k dielectric layer that is enriched in Si—H bonds on a transformed low k dielectric layer which has a Si—O network that is mechanically strengthened so that the CMP step does not form divot or scratch defects 17, 18 as shown in prior art FIG. 2. Moreover, the dielectric constant is decreased in the low k dielectric layer 23b and in the transformed low k dielectric layer 23a compared to the cured dielectric layer 23 which provides a better insulation of the second metal layer 28. The dual plasma treatment enables a more thermally stable low k dielectric layer 23b that leads to a higher resistance to breakdown in subsequent thermal cycles. There is also a lower likelihood of poisoning of a photoresist layer that is coated on low k dielectric layer 23b because of the improved hardness and thermal stability of the composite low k dielectric layer resulting from plasma treatments 24, 25. An increased resistance to water uptake is observed since the k value for a low k dielectric layer 23b and a transformed low k dielectric layer 23a that have been exposed to moisture increases by only 0.1 compared to an increase of 0.5 or more for an untreated low k dielectric layer 23.

The present invention is also the damascene structure shown in FIG. 6 that includes a first metal layer 21 formed in a planar substrate 20, an etch stop layer 22 formed on the substrate 20, a composite low k dielectric layer comprised of an organosilicon material which includes an upper low k dielectric layer 23b that is enriched in Si—H bonds on a low k dielectric layer 23a that has a dense network of Si—O bonds formed on etch stop layer 22, a via hole 26 formed in the low k dielectric layers 23a, 23b which extends through etch stop layer 22 and is aligned above first metal layer 21, a diffusion barrier layer 27 formed on the sidewalls of the via 26 and which is coplanar with low k dielectric layer 23b, and a second metal layer 28 that fills the via 26 and is coplanar with the low k dielectric layer 23b. The CMP polish rate and the dielectric constant of the composite low k dielectric layer are lower than can be obtained by depositing and curing an organosilicon layer of a similar composition. Alternatively, the diffusion barrier layer 27 not only coats the sidewalls of via 26 but is also formed on the bottom of via 26 to provide a continuous layer within the via.

In a second embodiment, illustrated in FIGS. 7-10, a low k dielectric layer that covers a metal layer in a gap fill process is modified for improved performance. The embodiment is not limited by the drawings and may apply to any metal pattern with an organosilicon based low k dielectric layer formed thereon.

Figure 7:
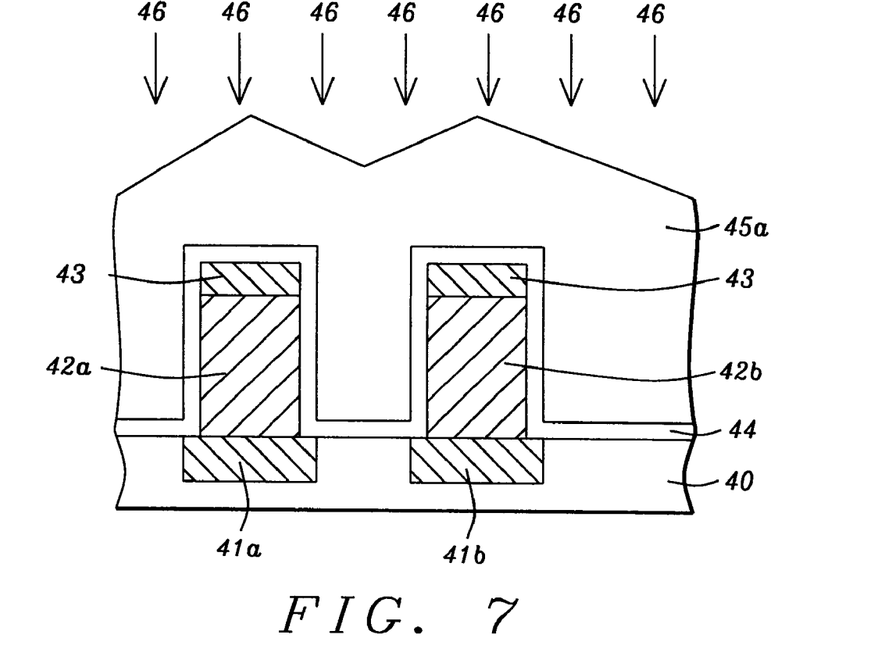
FIGS. 7-10 are cross-sectional views showing a plasma treatment method of the present invention in a second embodiment relating to a metallization layer.

Referring to FIG. 7, a substrate 40 is provided that is typically silicon and which generally contains active and passive devices (not shown). Substrate 40 is comprised of a first metal layer that has metal lines 41a, 41b that may be copper, tungsten, aluminum or Al/Cu. Substrate 40 may be further comprised of an optional diffusion barrier layer (not shown) that is formed on the sides and bottom of metal lines 41a, 41b. A method such as a CMP step is used to planarize the metal lines 41a, 41b to be coplanar with substrate 40.

A second metal layer with metal lines 42a, 42b comprised of copper, Al, or Al/Cu is formed by a conventional method above the metal lines 41a, 41b, respectively. Optionally, an anti-reflective coating (ARC) 43 is employed in the patterning of metal lines 42a, 42b as is appreciated by those skilled in the art. For example, a TiN layer may be selected as an ARC 43. An ARC is often needed to control reflectivity during the patterning of a photoresist layer (not shown) above ARC 43. The photoresist is used as an etch mask while the pattern is plasma etched through ARC 43 and through the second metal layer to form metal lines 42a, 42b. A conformal oxide layer 44 is then deposited by a CVD or PECVD technique on substrate 40 and on metal lines 42a, 42b. The oxide layer 44 may be comprised of a silicon rich oxide (SRO) or an undoped silicate glass (USG) layer. Alternatively, a USG layer may be deposited on an SRO layer to afford a composite oxide layer 44 on substrate 40 and on metal lines 42a, 42b.

A low k dielectric layer 45 is deposited by a CVD, PECVD, or by a spin-on method on oxide layer 44 to a thickness that covers metal lines 42a, 42b and the ARC 43. Preferably, the low k dielectric layer 45 has a thickness $t_1$ from about 2000 to 8000 Angstroms above the top of the ARC 43 and has good gap fill capability so that no voids are formed between the metal lines 42a, 42b. Note that the surface of the low k dielectric layer 45 is uneven and is higher above metal lines 42a, 42b than above portions of substrate 40 having no overlying metal lines. An improved method of depositing a low k dielectric layer over a metal line pattern is provided in TSMC patent application TS02-0520 which is herein incorporated by reference. For example, a high density plasma technique for depositing a low k dielectric layer 45 is useful in providing good gap fill capability.

In one embodiment, the low k dielectric layer 45 is comprised of a carbon doped oxide that is deposited by a CVD or PECVD technique in a process chamber. The carbon doped oxide is preferably SiCOH which is also known as organosilicate glass (OSG) and is available as Black Diamond™ from Applied Materials, CORAL™ from Novellus, or HOSP from Allied Signal. The Si source gas and a carbon source gas may be flowed separately into the CVD process chamber or a source gas comprised of Si, C, H, and optionally O may be employed. Typically, an oxygen precursor gas such as $N_2O$ or $O_2$ is also added to the gas mixture during the deposition. For example, an organosilane such as trimethylsilane may be flowed with $O_2$ into the process chamber. Optionally, an inert carrier gas such as Ar, $N_2$, or He may be used to transport the Si precursor into the process chamber if the precursor is a liquid with a high boiling point, for example.

When the low k dielectric layer 45 is a SiCOH layer, the composition is typically about 15-18 atomic % Si, about 28-30 atomic % oxygen, about 16-18 atomic % carbon, and about 36-38 atomic % hydrogen. However, depending on the deposition conditions and tool type, the composition may be different than in the aforementioned ranges.

In another embodiment, the low k dielectric layer 45 is comprised of a hydrogen silsesquioxane (HSQ) polymer or a methyl silsesquioxane (MSQ) polymer that is formed by a spin-on technique and cured by a conventional method known to those skilled in the art.

The low k dielectric layer 45 is typically cured after deposition by baking substrate 40 in a $N_2$ ambient at about 200° C. to 450° C. for 60 to 240 minutes. The curing step drives off moisture and residual solvents and monomers that may be contained within the film. The dielectric constant for a cured low k dielectric layer 45 is approximately 2.8 to 3.2. Unfortunately, the layer is porous and does not have the necessary mechanical strength to withstand subsequent processes such as a chemical mechanical polish (CMP) step that is likely to cause a divot or scratch defect as shown in FIG. 2. The low k dielectric layer 45 will also absorb moisture if exposed to air. Water uptake will increase the k value and can cause metal corrosion in the final device. Therefore, the low k dielectric layer 45 must be modified in order to meet the requirements of new technologies that have ground rules with deep sub-micron dimensions.

A key feature of this invention is a two step plasma treatment that may be performed in any plasma etch chamber but is preferably carried out under PECVD conditions. Preferably, the CVD process chamber for the two step PECVD treatment and the process chamber used to deposit the low k dielectric layer 23 are located in the same mainframe. As depicted in FIG. 7, the first treatment step 46 is performed with He plasma that is generated with a He flow rate of 1500 to 6000 sccm, a RF power of from 300 to 2500 Watts and preferably from 600 to 1200 Watts, a chamber pressure between 1 mtorr and 20 torr and preferably between 8 mtorr and 12 torr, and with a substrate heated between 100° C. and 500° C. and preferably 250° C. to 400° C. The He plasma treatment 46 is for a period of 10 to 360 seconds and preferably for 45 to 90 seconds.

The inventors have unexpectedly found that the He plasma treatment is able to modify the low k dielectric layer 45 into a transformed low k dielectric layer 45a that has a lower dielectric constant and is hardened compared to the low k dielectric layer 45. It is believed that smaller cage like arrangements of Si—O bonds become more highly crosslinked to form a larger network of Si—O bonds that increases mechanical stability. There is no net loss of Si—$CH_3$ or Si—O bonds as a result of the He plasma treatment 46 as indicated by no change in $CH_4$ or $H_2O$ content in a residual gas analysis (RGA). RGA results (not shown) are plotted as pressure vs. time in seconds and show a flat baseline for water and methane. Furthermore, FTIR spectra show no change in the peak at about 1270 $cm^{-1}$ corresponding to Si—C bond stretching when comparing a low k dielectric layer 45 after curing (FIG. 11) to a transformed low k dielectric layer 45a after a He plasma treatment 46 (FIG. 12). However, the k value is lowered in a He plasma treated low k dielectric layer as shown in Table 1 in Example 1. The k value decreases from 3 for a cured low k dielectric layer 45 to 2.78 for the transformed low k dielectric layer 45a.

Although a lower k value as a result of the He plasma treatment 46 is beneficial, the inventors have discovered that the dielectric constant of the transformed low k dielectric layer 45a is further reduced by a second treatment involving $H_2$ plasma. Surprisingly, the dielectric constant resulting from a He plasma treatment followed by a $H_2$ plasma treatment (Sample 6 in Table 1) is less than can be achieved by two He plasma treatments (Sample 4) or with two $H_2$ plasma treatments (Sample 3) of similar duration.

Figure 8:
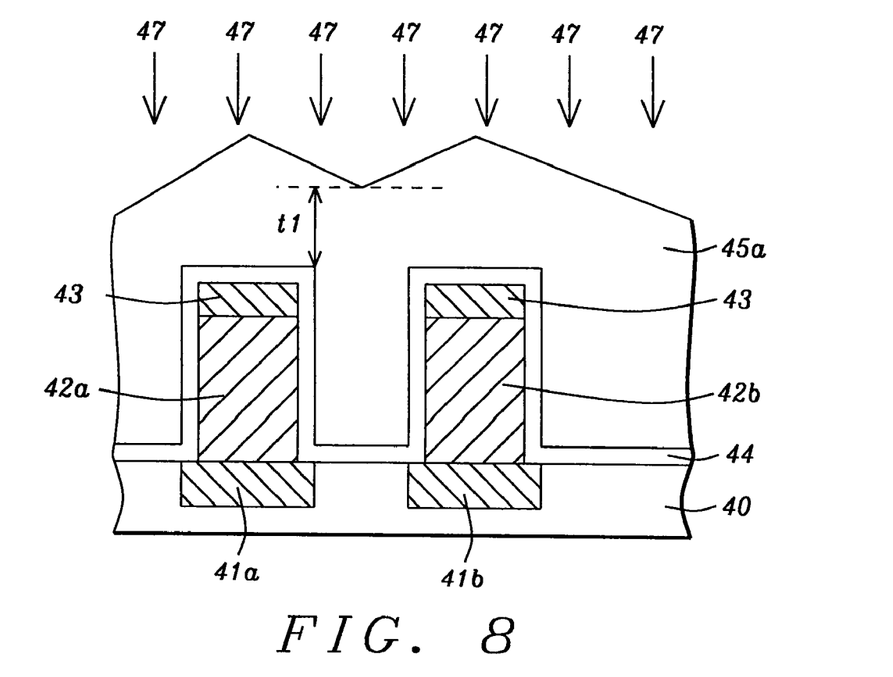

Referring to FIG. 8, $H_2$ plasma 47 is preferably generated in the same process chamber used for the He plasma treatment 46 without breaking a vacuum. Substrate 40 with the transformed low k dielectric layer 45a is subjected to a $H_2$ plasma generated with the following conditions: a $H_2$ flow rate from 1500 to 6000 sccm; a RF power of from 300 to 2500 Watts and preferably 600 to 1200 Watts; a chamber pressure of 1 mTorr to 10 Torr; and a substrate temperature of 100° C. to 500° C. and preferably 250° C. to 400° C. The $H_2$ plasma treatment 47 is performed for a period of about 10 to 360 seconds and preferably for 45 to 90 seconds.

Figure 9:
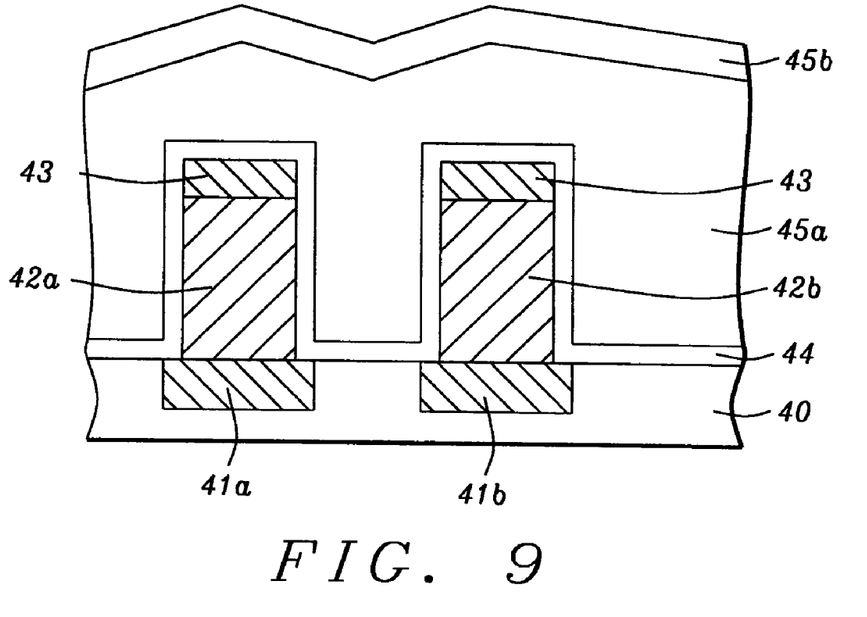

Unlike the He plasma treatment 46, the $H_2$ plasma treatment 47 does result in a net loss of Si—O and Si—$CH_3$ bonds due to cleavage of Si—O and Si—C bonds. A composite low k dielectric layer comprised of a low k dielectric layer 45b that is enriched in Si—H bonds and which is believed to be from about 1000 to 3000 Angstroms thick and the transformed low k dielectric layer 45a is formed as depicted in FIG. 9. Note that an upper portion of the transformed low k dielectric layer 45a in FIG. 8 has been converted to the low k dielectric layer 45b in FIG. 9. Therefore, the thickness of the composite low k dielectric layer in FIG. 9 is about the same as the thickness of the transformed low k dielectric layer 45a in FIG. 8.

The FTIR spectrum in FIG. 13 shows that the absorbance at about 1270 $cm^{-1}$ corresponding to Si—C bond stretching in the low k dielectric layer 45b has a lower intensity than the 1270 $cm^{-1}$ absorbance for the cured low k dielectric layer 45 in FIG. 11. It is also believed that some dangling Si bonds or Si atoms with a radical (unpaired electron) are converted to Si—H bonds in the low k dielectric layer 45b. A RGA (not shown) of the $H_2$ plasma treated low k dielectric layer 45b indicates the presence of $H_2O$ and $CH_4$ because of Si—C and Si—O bond cleavage. The formation of Si—H bonds causes a further decrease in the dielectric constant as shown by Sample 6 in Table 1. The k value is lowered because of a higher H content and lower oxygen content in the composite low k dielectric layer compared to the transformed low k dielectric layer 45a.

Figure 10:
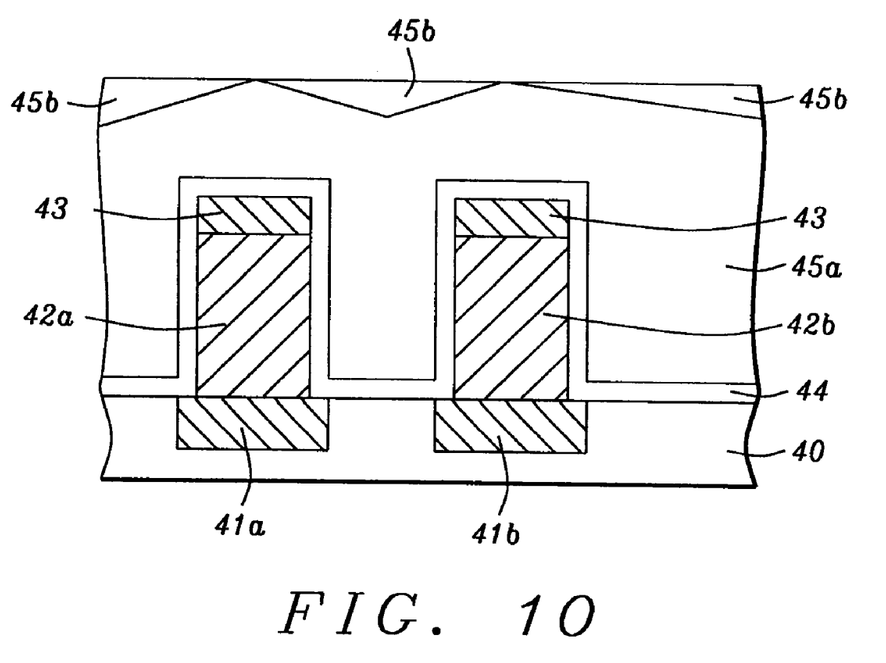

Referring to FIG. 10, the surface of the composite low k dielectric layer comprised of the low k dielectric layer 45b and the transformed low k dielectric layer 45a must be planarized in order for subsequent processes such as photoresist patterning (not shown) to have an optimum process latitude. Typically, a CMP step is employed to planarize the low k dielectric layer 45b. Note that some of low k dielectric layer 45a may also be removed in the planarization step.

An advantage of the present invention is that the plasma treatment steps 46, 47 transform the cured dielectric layer 45 into a composite low k dielectric layer comprised of an upper low k dielectric layer that is enriched in Si—H bonds on a low k dielectric layer which has a Si—O network that is mechanically strengthened so that the CMP step does not form divot or scratch defects in the low k dielectric layer 45b or in the transformed low k dielectric layer 45a. Moreover, the dielectric constant is decreased in the composite low k dielectric layer compared to the cured low k dielectric layer 45 to provide a better insulation of the metal lines 42a, 42b on substrate 40.

Another advantage of the composite low k dielectric layer is that the low k dielectric layer 45b and the transformed low k dielectric layer 45a are stabilized. For example, an increased resistance to water uptake is observed since the k value for the composite low k dielectric layer that has been exposed to moisture increases by only 0.1 compared to an increase of 0.5 or more for an untreated low k dielectric layer 45. In addition, the dual plasma treatment enables a more thermally stable low k dielectric layer 45b that leads to a higher resistance to breakdown in subsequent thermal cycles. There is also a lower likelihood of poisoning of a photoresist layer that comes in contact with the composite low k dielectric layer because of the improved hardness and thermal stability of the composite low k dielectric layer as a result of the plasma treatments 46, 47. The invention can be readily implemented in manufacturing since the He/$H_2$ treated low k dielectric layer is compatible with state of the art deposition and etching techniques.

The present invention is also an interconnect structure shown in FIG. 10 that includes a first metal layer comprised of metal lines 41a, 41b formed in a substrate 40, a second metal layer having metal lines 42a, 42b with sidewalls and a top surface formed on metal lines 41a, 41b, respectively, an ARC layer 43 on the top surface of the metal lines 42a, 42b, a conformal oxide layer 44 formed on substrate 40, on the sidewalls of metal lines 42a, 42b, and on ARC 43, and a composite organosilicon low k dielectric layer comprised of a lower low k dielectric layer 45a with a dense network of Si—O bonds formed on the conformal oxide layer 44 and an upper low k dielectric layer 45b that is enriched in Si—H bonds. The CMP polish rate and the dielectric constant of the composite low k dielectric layer are lower than can be obtained by depositing and curing an organosilicon layer of a similar composition. Note that the level of the low k dielectric layer 45a fills the gap between metal lines 42a, 42b and extends to a height that is above the top surface of the conformal oxide layer 44 on metal lines 42a, 42b. The top surface of the low k dielectric layer 42a is uneven and reaches a highest level above substrate 40 at points above metal lines 42a, 42b. The top surface of the low k dielectric layer 42b is planar and may not cover the low k dielectric layer 42a at some points above the metal lines 42a, 42b.

EXAMPLE 1

This example illustrates the advantage of the present invention with regard to a further lowering of the dielectric constant in a low k dielectric layer by a post-deposition plasma treatment. A 5000 Angstrom thick SiCOH layer was deposited on several silicon wafers in a CVD process chamber using a PECVD process comprising 2,4,6,8-tetramethylcyclo-tetrasiloxane (TMCTS), $CH_4$, and $O_2$ precursors at flow rates of 6400, 1600, and 1600 sccm, respectively at 250.degree. C. with a chamber pressure of 5 torr, and a RF power of 1000 Watts. The wafers were cured by baking at 400.degree. C. in an oven for 60 minutes. A k value of 3.0 was observed by a measurement performed with a Hg probe as shown in Table 1. Sample 1 was obtained by subjecting a first wafer with a SiCOH layer to $H_2$ plasma with a RF power of 900 Watts, a $H_2$ flow rate of 1800 sccm, a chamber pressure of 5 torr, and a substrate temperature of 400.degree. C. for 60 seconds. Sample 2 was generated in a similar fashion except that a He flow rate of 6000 sccm was used in place of a $H_2$ flow rate of 1800 sccm on a second wafer. Sample 3 was produced by treating a SiCOH layer on a third wafer as in Sample 1 except the $H_2$ treatment was performed twice for a total of 120 seconds. Likewise, the He process to give Sample 2 was performed twice on a SiCOH layer on a fourth wafer to yield Sample 4. Sample 5 was obtained by treating a SiCOH layer on a fifth wafer with the $H_2$ plasma treatment described above for 60 seconds followed by the He plasma treatment for 60 seconds. Sample 6 was obtained by treating a SiCOH layer on a sixth wafer with the He process for 60 seconds followed by the $H_2$ process for 60 seconds.

As shown in Table 1, a He plasma treatment reduces the k value of a cured SiCOH layer from 3.0 to 2.78 and a second He plasma treatment further reduces the dielectric constant to 2.739. Similarly, a $H_2$ plasma treatment reduces the k value of a cured SICOH layer and a second $H_2$ plasma treatment further lowers the k value. Surprisingly, a $H_2$ treatment followed by a He treatment provides a lower k value than two $H_2$ treatments and a He treatment followed by a $H_2$ treatment yields a lower k value than two He treatments. The process that includes a He treatment followed by a $H_2$ treatment yields a SiCOH layer with a lower dielectric constant than other treatments. Note that all these results are for 60 second treatment periods and that k values may be adjusted higher or lower based on shorter or longer plasma treatment times, respectively.

TABLE 1

Dielectric Constant of a SiCOH Layer After Different Plasma Treatments

| | $1^{st}$ treatment | $2^{nd}$ treatment | K value |
|---|---|---|---|
| SiCOH after cure | — | — | 3.0 |
| Sample 1 | $H_2$ | None | 2.76 |
| Sample 2 | He | None | 2.78 |
| Sample 3 | $H_2$ | $H_2$ | 2.731 |
| Sample 4 | He | He | 2.739 |
| Sample 5 | $H_2$ | He | 2.727 |
| Sample 6 | He | $H_2$ | 2.720 |

While this invention has been particularly shown and described with reference to, the preferred embodiments thereof, it will be understood by those skilled in the art that various changes in form and details may be made without departing from the spirit and scope of this invention.

What is claimed is:
1. A method of lowering the dielectric constant and increasing the thermal stability and mechanical stability of a low k dielectric layer on a substrate, comprising:
   (a) providing a substrate;
   (b) forming a low k dielectric layer comprised of an organosilicon material on said substrate, wherein the low k dielectric layer has a first dielectric constant;

(c) performing a first treatment comprised of He plasma on said low k dielectric layer in a process chamber to form a transformed low k dielectric layer; and (d) performing a second treatment comprised of $H_2$ plasma on said transformed low k dielectric layer in a process chamber to form a final low k dielectric layer, wherein the transformed low k dielectric layer has a top portion that becomes enriched in Si—H bonds during the $H_2$ plasma treatment, and wherein the final low k dielectric layer has a second dielectric constant, wherein the second dielectric constant is less than the first dielectric constant.

2. The method of claim 1 further comprised of curing the low k dielectric layer before performing the He plasma treatment.

3. The method of claim 1 wherein the low k dielectric layer is comprised of carbon doped silicon oxide, hydrogen silsesquioxane (HSQ), or methyl silsesquioxane (MSQ).

4. The method of claim 3 wherein said carbon doped oxide layer is SiCOH with a composition of about 15-18 atomic % Si, about 28-30 atomic % oxygen, about 16-18 atomic % carbon, and about 36-38 atomic % hydrogen.

5. The method of claim 1 wherein the first and second treatments are performed with a plasma enhanced CVD (PECVD) process.

6. The method of claim 1 wherein said first and second treatments include a gas flow rate from about 1500 to 6000 standard cubic centimeters per minute (sccm).

7. The method of claim 1 wherein the first and second plasma treatments are each performed during a period of about 10 to 360 seconds.

8. The method of claim 1 wherein the process chamber pressure during said first and second treatments is between about 1 mTorr and 20 Torr.

9. The method of claim 1 wherein the He plasma in said first treatment and the $H_2$ plasma in said second treatment is generated by applying a RF power between about 300 and 2500 Watts.

10. The method of claim 1 wherein said substrate is heated between about 100° C. and 500° C. during said first and second treatments.

11. The method of claim 1 wherein said second treatment is performed in the same process chamber as said first treatment without breaking a vacuum between the two treatments.

12. A method of lowering the dielectric constant and increasing the thermal stability and mechanical stability of a low k dielectric layer in a damascene process, comprising:

providing a substrate having an etch stop layer formed thereon;

depositing a low k dielectric layer comprised of an organosilicon compound on said etch stop layer, wherein the low k dielectric layer has a first dielectric constant;

performing a first treatment comprised of He plasma on said low k dielectric layer in a process chamber to form a transformed low k dielectric layer;

stopping the performing the first treatment;

performing a second treatment comprised of $H_2$ plasma on said transformed low k dielectric layer to form a composite low k dielectric layer comprised of a transformed low k dielectric layer that is enriched in Si—H bonds on a transformed low k dielectric layer that has a mechanically stabilized network of Si—O bonds, wherein the composite low k dielectric layer has a second dielectric constant, and wherein the second dielectric constant is less than the first dielectric constant;

forming an opening in said composite low k dielectric layer that extends through said etch stop layer; and depositing a diffusion barrier layer on the sidewalls of said opening, depositing a metal layer on said diffusion barrier layer that fills said opening, and planarizing said metal layer and said diffusion barrier layer to a level that is coplanar with said composite low k dielectric layer.

13. The method of claim 12 further comprised of curing the low k dielectric layer before performing the He plasma treatment.

14. The method of claim 12 wherein the low k dielectric layer is comprised of carbon doped silicon oxide, HSQ, or MSQ and has a thickness between about 1000 and 10000 Angstroms.

15. The method of claim 14 wherein the low k dielectric layer is a carbon doped silicon oxide layer which is SiCOH with a composition of about 15-18 atomic % Si, about 28-30 atomic % oxygen, about 16-18 atomic % carbon, and about 36-38 atomic % hydrogen.

16. The method of claim 12 wherein said first and second treatments each include a gas flow rate from about 1500 to 6000 sccm and have a duration from about 10 to 360 seconds.

17. The method of claim 12 wherein the process chamber pressure during said first and second treatments is between about 1 mTorr and 20 Torr.

18. The method of claim 12 wherein the He plasma in said first treatment and the $H_2$ plasma in said second treatment is generated by applying a RF power between about 300 and 2500 Watts.

19. The method of claim 12 wherein said substrate is heated to a temperature between about 100° C. and 500° C. during said first and second treatments.

20. The method of claim 12 wherein the transformed low k dielectric layer enriched in Si—H bonds has a thickness from about 1000 to 3000 Angstroms.

21. The method of claim 12 wherein said first treatment is performed in the same process chamber as said second treatment.

22. The method of claim 12 wherein the diffusion barrier layer is comprised of one or more of Ta, TaN, TaSiN, Ti, TiN, W, or WN and the metal layer is copper.

23. A method of lowering the dielectric constant and increasing the thermal stability and mechanical stability of a low k dielectric layer in an interconnect structure, comprising:

(a) providing a substrate with a metal layer comprised of metal lines;

(b) depositing a conformal oxide layer on said substrate, and on said metal lines;

(c) depositing a low k dielectric layer comprised of an organosilicon material on said conformal oxide layer by a CVD, PECVD, or spin-on method;

(d) curing said low k dielectric layer, wherein the curing provides a cured low k dielectric layer, and wherein the cured low k dielectric layer has a first dielectric constant;

(e) performing a first treatment comprised of a He plasma on said cured low k dielectric layer to form a transformed low k dielectric layer, wherein the transformed layer has a second dielectric constant and wherein the second dielectric constant is less than the first dielectric constant; and (f) performing a second treatment comprised of a $H_2$ plasma on said transformed low k dielectric layer to form a composite low k dielectric layer being enriched in Si—H bonds and having a mechanically stabilized network of Si—O bonds, wherein the composite low k dielectric layer has a third dielectric constant, and the third dielectric constant is less than the second dielectric constant.

* * * * *